(12) United States Patent
Waheed et al.

(10) Patent No.: US 9,264,280 B1
(45) Date of Patent: Feb. 16, 2016

(54) AUTOMATIC RECEIVED GAIN CONTROL

(71) Applicant: FREESCALE SEMICONDUCTOR, INC., Austin, TX (US)

(72) Inventors: Khurram Waheed, Austin, TX (US); Steven M. Bosze, Cedar Park, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/603,443

(22) Filed: Jan. 23, 2015

(51) Int. Cl.
*H04L 27/38* (2006.01)
*H03G 3/30* (2006.01)

(52) U.S. Cl.
CPC .......... *H04L 27/3809* (2013.01); *H03G 3/3052* (2013.01)

(58) Field of Classification Search
None
See application file for complete search history.

(56) References Cited

U.S. PATENT DOCUMENTS

| | | | |
|---|---|---|---|
| 7,030,795 B1 | 4/2006 | Saunders et al. | |
| 7,348,808 B2 | 3/2008 | Moussavi | |
| 7,353,010 B1 | 4/2008 | Zhang et al. | |
| 7,397,304 B2 | 7/2008 | Wang | |
| 7,548,738 B2 * | 6/2009 | Srinivasan et al. | 455/232.1 |
| 7,890,075 B2 | 2/2011 | Xin et al. | |
| 7,929,650 B2 | 4/2011 | Sobchak et al. | |
| 8,614,603 B1 | 12/2013 | Wyse et al. | |
| 2002/0120937 A1 * | 8/2002 | Chang | 725/68 |
| 2003/0081693 A1 * | 5/2003 | Raghavan et al. | 375/298 |
| 2012/0034895 A1 * | 2/2012 | Xuechu et al. | 455/341 |

* cited by examiner

*Primary Examiner* — Leon-Viet Nguyen

(57) ABSTRACT

A semiconductor device includes a receiver system having a first set of amplifiers, a second set of amplifiers, and an automatic gain control (AGC) module to receive first high and low detection signals from a first peak detector, and receive second high and low detection signals from a second peak detector. When the first high detection signal is set, a step decrease in at least one of a first gain control signal and a second gain control signal is taken. When the first high detection signal is not set and the second high detection signal is set, a second step decrease in at least one of the first gain control signal and the second gain control signal is taken. The first gain control signal is used in the first set of amplifiers. The second gain control signal is used in the second set of amplifiers.

20 Claims, 7 Drawing Sheets

AUTOMATIC RECEIVED GAIN CONTROL

BACKGROUND

1. Field

This disclosure relates generally to gain control, and more specifically, to gain control of a receiver using signal peak tracking.

2. Related Art

Communication protocols have been widely adopted for providing connectivity in a number of applications, including healthcare, sports, and sensor applications. Such protocols often use a preamble sequence at the beginning of a transmission that is used to identify a valid start of the transmission. The preamble sequence indicates to a receiver that a transmission is underway.

BRIEF DESCRIPTION OF THE DRAWINGS

The present invention may be better understood, and its numerous objects, features, and advantages made apparent to those skilled in the art by referencing the accompanying drawings.

The present invention is illustrated by way of example and is not limited by the accompanying figures, in which like references indicate similar elements, unless otherwise noted. Elements in the figures are illustrated for simplicity and clarity and have not necessarily been drawn to scale.

DETAILED DESCRIPTION

Figure 1:
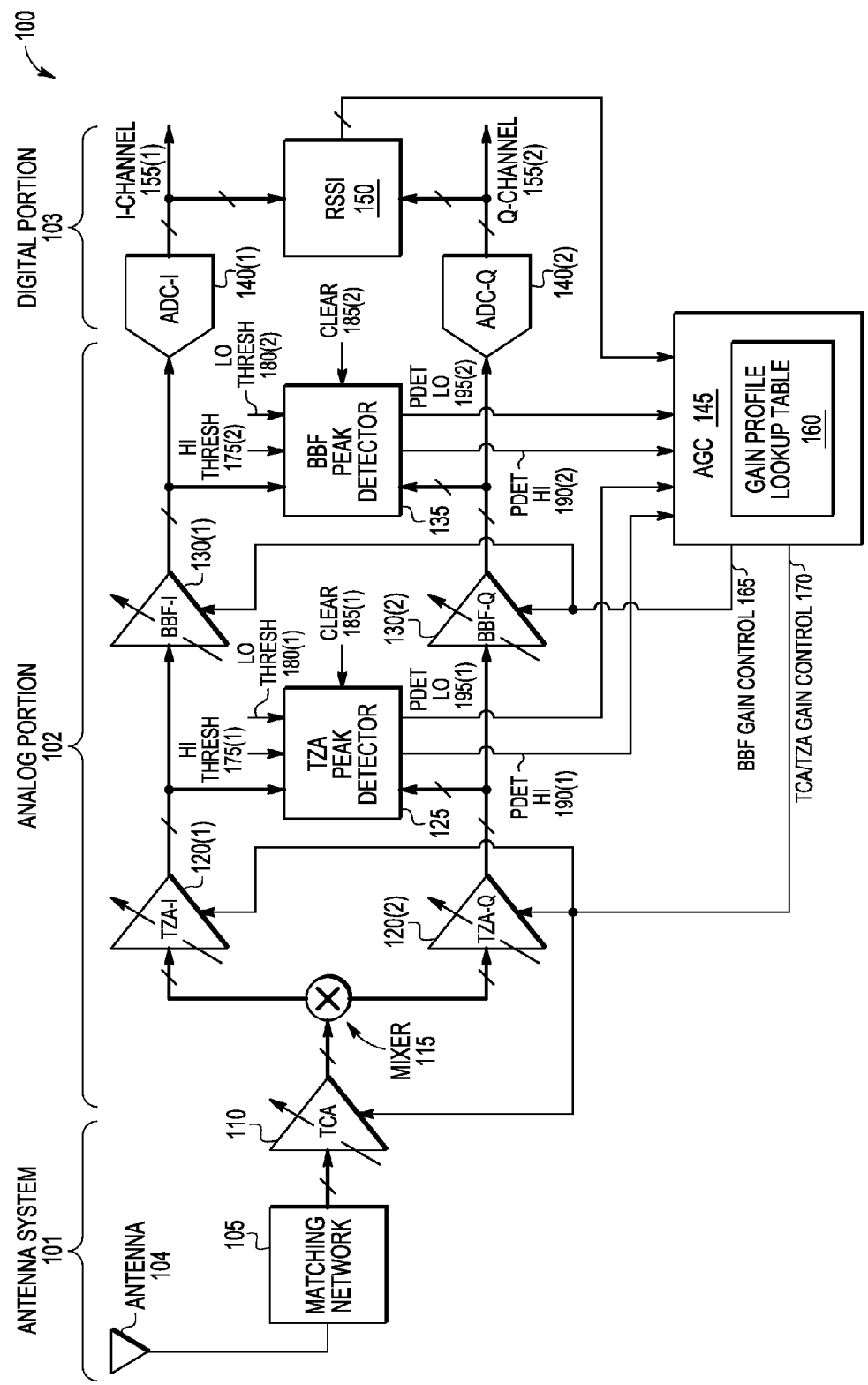
FIG. 1 illustrates a block diagram depicting an example receiver system in which the present disclosure is implemented, according to some embodiments.

The following sets forth a detailed description of various embodiments intended to be illustrative of the invention and should not be taken to be limiting.

Overview

Communication protocols targeting low-power consumption often use a short preamble sequence comprising 8 or more symbol periods (on the order of 8-10 us) that is used to identify a valid start of a transmission of data. To ensure successful reception of a packet, a receiver needs to adjust its front-end gain to an optimal value ideally within the first half of the preamble sequence time (e.g., 3-4 us) so that the remaining preamble sequence time can be used for reliable packet detection, channel estimation, and frequency offset estimation. If the optimal gain level is not achieved within that short time, packets are lost (since the receiver is not yet prepared to receive packets) and data transmission is slowed due to having to resend those lost packets. Optimal gain level is vital to successful reception of packets, but achieving optimal gain level within half of the short preamble sequence is very difficult, especially since the properties of the signal carrying a data transmission may change on each data transmission. It is also difficult to maintain the optimal gain level as the signal may also change dynamically (e.g., over time) during a given data transmission.

The present disclosure provides an automatic gain control scheme for a receiver that is agile enough to deal with dynamic operational signal scenarios, such as receiver gain adjustments due to adjacent channel interference and both in-band and out-of-band blocking. The disclosed automatic receiver gain control scheme provides for two peak detection circuits placed in the receiver and a received signal strength indicator (RSSI) measurement system. For example, one peak detector is placed after a low noise amplifier (LNA) of the receiver and another peak detector is placed after a baseband filtering amplifier (BBF) of the receiver. Each peak detector monitors a received signal and simultaneously detects whether peaks of the received signal trigger a programmable set of high and low thresholds.

An automatic gain control (AGC) module monitors both peak detectors and, based on whether any threshold has been triggered, adjusts one or more gain levels of the LNA and the BBF to maintain the signal level between the high and low thresholds. The AGC module is able to both increment or decrement the gain immediately in response to detection that a threshold has been triggered.

The AGC module also monitors an analog-to-digital converter (ADC) signal strength indicator included in the RSSI and, based on whether a stronger or weaker signal level is desired in the ADC, adjusts one or more gain levels of the LNA and the BBF. The AGC may also use detection of a sharp change occurring in RSSI level (as compared to a programmable RSSI level change) as another basis for adjusting one or more gain levels of the LNA and the BBF.

Example Embodiments

FIG. 1 illustrates a block diagram depicting an example receiver system 100 in which the present disclosure is implemented. Although a number of components are illustrated in a particular arrangement in FIG. 1, receiver system 100 may include additional or fewer components and such components may have a different arrangement. It is noted that analog portion 102 includes thick lines having tick marks, where such thick lines indicate differential signals in some embodiments. In other embodiments, such signals need not be differential and instead may be single-ended signals. It is also noted that digital portion 103 includes thick lines having tick marks, which indicate a digital multi-bit data bus signal.

Receiver system 100 includes an antenna system 101, an analog portion 102, and a digital portion 103 for receiving RF (radio frequency) signals. Antenna system 101 includes antenna 104 and matching network 105. Analog portion 102 includes a transconductance amplifier (TCA) 110, a mixer 115, a first transimpedance amplifier (TZA-I) 120(1) for an in-phase signal path (I-path), a second transimpedance amplifier (TZA-Q) 120(2) for a quadrature signal path (Q-path), a first baseband filtering amplifier (BBF-I) 130(1) for the I-path, a second baseband filtering amplifier (BBF-Q) 130(2) for the Q-path, a transimpedance amplifier (TZA) peak detector 125, and a baseband filtering amplifier (BBF) peak detector 135. Analog portion 102 also includes an initial portion of a first analog-to-digital converter (ADC-I) 140(1) for the I-path and an initial portion of a second analog-to-digital converter (ADC-Q) 140(2) for the Q-path. The combination of TCA 110, TZA-I 120(1), and TZA-Q 120(2) may also be referred to herein as a low noise amplifier (LNA). Digital portion 103 includes a remaining portion of ADC-I 140(1) and a remaining portion of ADC-Q 140(2), a received signal strength indication (RSSI) circuit 150, and an automatic gain control (AGC) module 145. Each of these components are implemented, at least in part, as circuitry. TCA, TZA-I, TZA-Q, BBF-I, and BBF-Q, components are considered to be gain elements of receiver system 100. The components of receiver system 100 are further discussed below.

In antenna system 101, antenna 104 is configured to receive a signal and provide the signal to matching network 105. Matching network 105 is configured to suppress out-of-band RF signals and result in improved impedance matching between the antenna and the TCA 102 input. This allows for coupling of the received in-band RF antenna signal to the analog portion 102 of receiver system 100. In some embodiments, matching network 105 is also configured to transform the single-ended antenna signal into a differential voltage signal (e.g., by using a balun or similar device to produce a negative voltage signal and a positive voltage signal of equal magnitude), while also matching the single ended impedance of the antenna to the differential input impedance of the analog portion of receiver system 100. Matching network 105 provides the RF input signal to TCA 110.

In analog portion 102 of receiver system 100, TCA 110 is configured to receive the voltage signal (e.g., single-ended or differential) from matching network 105 and to output a current signal proportional to the received voltage signal based on a programmable gain of TCA 110. The current signal is then provided to mixer 115 that is configured to mix the current signal with a first local oscillator signal to produce an I-path current signal that is provided to TZA-I 120(1), and to mix the current signal with a second local oscillator signal to produce a Q-path current signal that is provided to TZA-Q 120(2). The second local oscillator signal is 90° offset (or delayed in time) from the first local oscillator signal. The first and second local oscillators may be set at a same frequency (e.g., 2.4 GHz).

TZA-I 120(1) is configured to receive the I-path current signal and output an I-path voltage signal proportional to the I-path current signal based on a programmable gain of TZA-I 120(1). TZA-Q 120(2) is configured to receive the Q-path current signal and output a Q-path voltage signal proportional to the Q-path current signal based on a programmable gain of TZA-Q 120(2). TCA, TZA-I, and TZA-Q each receive a gain control signal that programs the respective gain of TCA, TZA-I and TZA-Q, further discussed below in connection with FIG. 7. In some embodiments, a single (e.g., tied) gain control signal is provided to TCA, TZA-I, and TZA-Q, which is illustrated in FIG. 1 as TCA/TZA gain control 170. In other embodiments (not shown), separate and independent gain control signals are provided to TCA, TZA-I, and TZA-Q.

TZA peak detector 125 is configured to receive the I-path voltage signal and the Q-path voltage signal, a programmable high threshold value 175(1), a programmable low threshold value 180(1), and a clear signal 185(1). TZA peak detector 125 is configured to detect whether the I-path and Q-path voltage signals exceed a high threshold specified by high threshold value 175(1) and exceed a low threshold specified by low threshold value 180(1). In response to detection of either the I-path voltage signal and the Q-path voltage signal exceeding the high threshold, TZA peak detector 125 is configured to immediately output a high peak detection signal (illustrated as pdet_hi 190(1) in FIG. 1) to notify AGC module 145. In response to detection of either the I-path voltage signal and the Q-path voltage signal exceeding the low threshold, TZA peak detector 125 is configured to immediately output a low peak detection signal (illustrated as pdet_lo 195(1) in FIG. 1) to notify AGC module 145. TZA peak detector 125 is configured to be disabled or reset in response to clear signal 185(1) being triggered, where the I-path and Q-path voltage signals are ignored during the time that clear signal 185(1) is triggered. Clear signal 185(1) is triggered by AGC module 145 after AGC module 145 applies a gain adjustment or change to one or more gain elements in receiver system 100, as further discussed below.

BBF-I 130(1) is configured to receive the I-path voltage signal and output a filtered I-path voltage signal proportional to the received I-path voltage signal based on a programmable gain of BBF-I. BBF-Q 130(2) is configured to receive the Q-path voltage signal and output a filtered Q-path voltage signal proportional to the received Q-path voltage based on a programmable gain of BBF-Q. BBF-I and BBF-Q are each configured to pass frequency signals inside of a configured frequency interval of (0,B), where B is the cutoff frequency of the baseband filter. The cutoff frequencies of BBF-I and BBF-Q are set to allow for signals within a desirable frequency bandwidth of the I-path voltage signal and the Q-path voltage signal, respectively, to propagate to ADC-I and ADC-Q.

BBF peak detector 135 is configured to receive the filtered I-path voltage signal and the filtered Q-path voltage signal, a programmable high threshold value 175(2), a programmable low threshold value 180(2), and a clear signal 185(2). BBF peak detector 135 is configured to detect whether the filtered I-path and filtered Q-path voltage signals exceed a high threshold specified by high threshold value 175(2) and exceed a low threshold specified by low threshold value 180(2). In response to detection of either the filtered I-path voltage signal and the filtered Q-path voltage signal exceeding the high threshold, BBF peak detector 135 is configured to immediately output a high peak detection signal (illustrated as pdet_hi 190(2) in FIG. 1) to notify AGC module 145. In response to detection of either the filtered I-path voltage signal and the filtered Q-path voltage signal exceeding the low threshold, BBF peak detector 135 is configured to immediately output a low peak detection signal (illustrated as pdet_lo 195(2) in FIG. 1) to notify AGC module 145. BBF peak detector 135 is configured to be disabled or reset in response to clear signal 185(2) being triggered, where the filtered I-path and filtered Q-path voltage signals are ignored during the time that clear signal 185(2) is triggered. Clear signal 185(2) is triggered by AGC module 145 after AGC module 145 applies a gain adjustment or change to one or more gain elements in receiver system 100, as further discussed below.

ADC-I 140(1) is configured to receive the filtered I-path voltage signal and ADC-Q 140(2) is configured to receive the filtered Q-path voltage signal. In the digital portion 103 of receiver 100, ADC-I is further configured to output a digital signal that represents the filtered I-path voltage signal, illustrated in FIG. 1 as I-channel 155(1). ADC-Q 140(2) is further configured to output a digital signal that represents the filtered Q-path voltage signal, illustrated in FIG. 1 as Q-channel 155(2). I-channel and Q-channel are available for further digital processing.

RSSI circuit 150 is configured to receive I-channel and Q-channel and to calculate a power measurement, also referred to as an RSSI level, of each of the I-channel and Q-channel. RSSI circuit 150 is also configured to detect whether the RSSI levels of the I-channel and Q-channel exceed a programmable high RSSI threshold and whether the RSSI levels fail to exceed a programmable low RSSI threshold. RSSI circuit 150 is also configured to detect whether a change in RSSI levels for either the I-channel and the Q-channel exceeds a programmable delta RSSI threshold, and whether the headroom of the ADC (or the difference between the expected operating signal level and a maximum level that the ADC can pass without signal clipping) exceeds or fails to exceed a programmable headroom threshold. RSSI circuit 150 is configured to immediately output a number of RSSI detection signals corresponding to each of these RSSI detections to notify AGC module 145.

AGC module 145 is configured to receive detection signals from TZA peak detector, BBF peak detector, and RSSI circuit. AGC module 145 is also configured to monitor whether the low peak detection signals received from TZA and BFF peak detectors are received within a low peak monitoring window, which is some programmable amount of time. Each time AGC module 145 receives a low peak detection signal from a peak detector (e.g., from either TZA or BBF peak detectors), AGC module 145 resets the monitoring window. AGC module 145 then detects whether the monitoring window has expired (due to the signal failing to exceed the low threshold within the monitoring window). In some embodiments, each peak detector is associated with a respective monitoring window.

Figure 2:
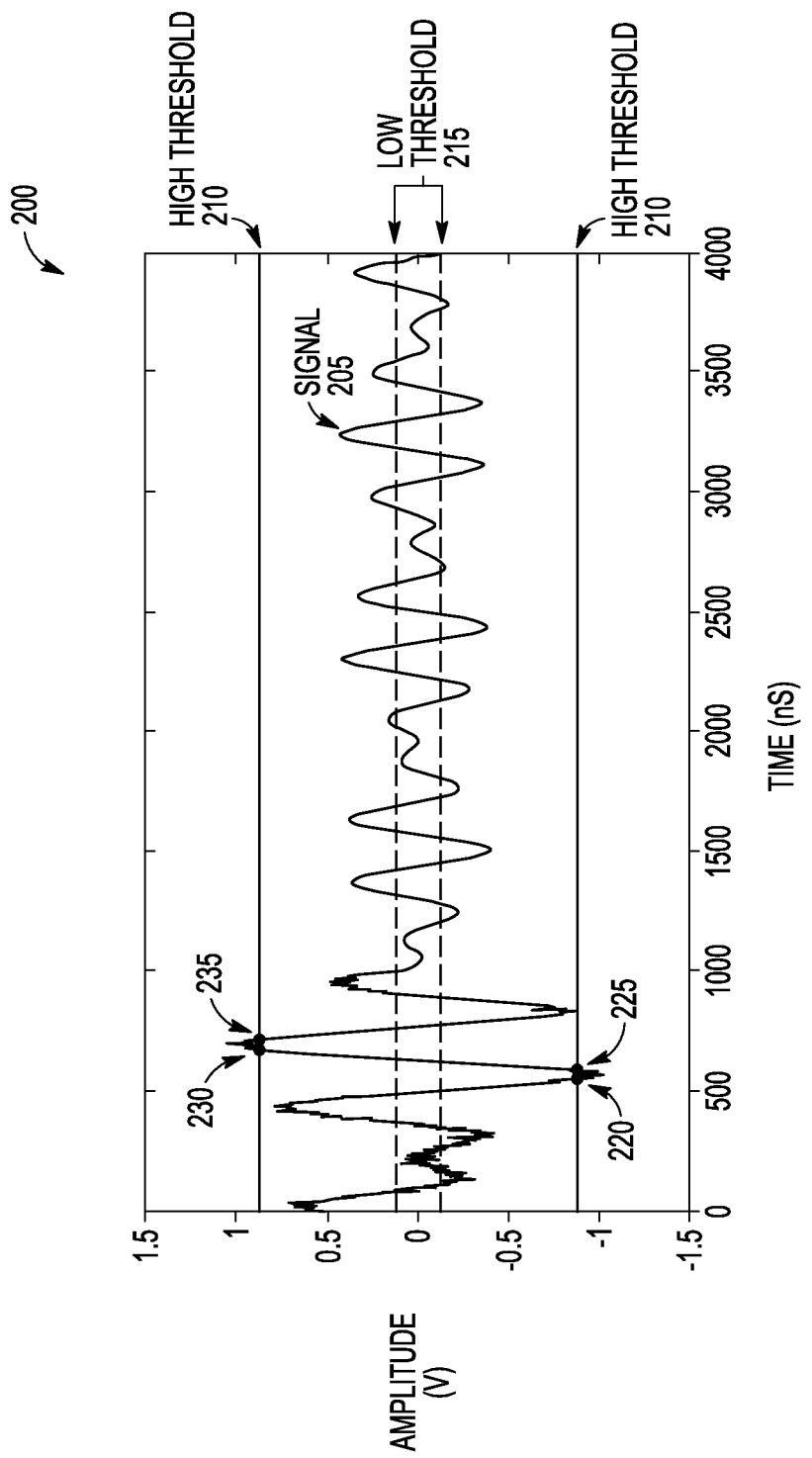
FIG. 2-4 illustrate waveforms of example signals presented to a peak detector of a receiver system in which the present disclosure is implemented, according to some embodiments.
Figure 3:
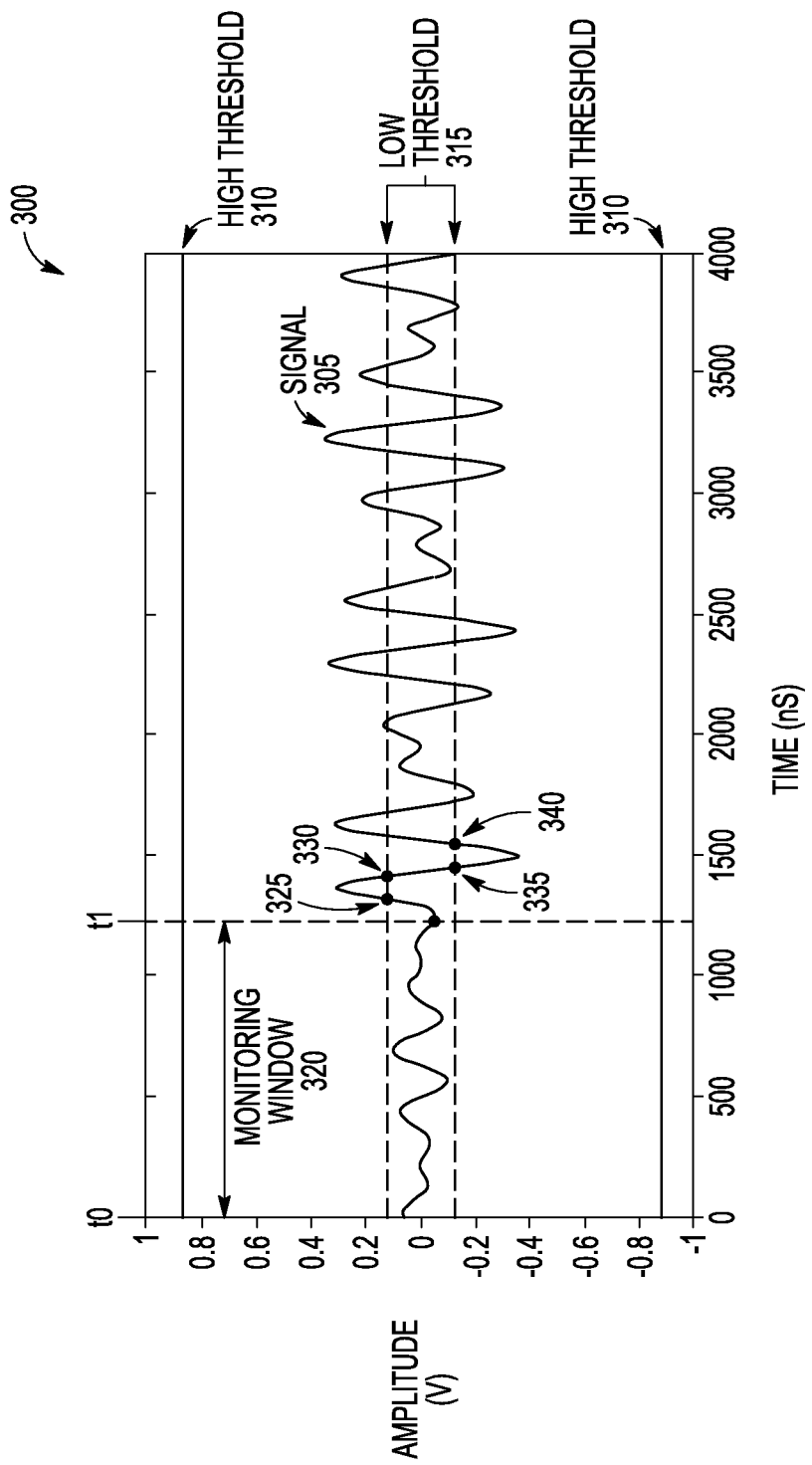
Figure 4:
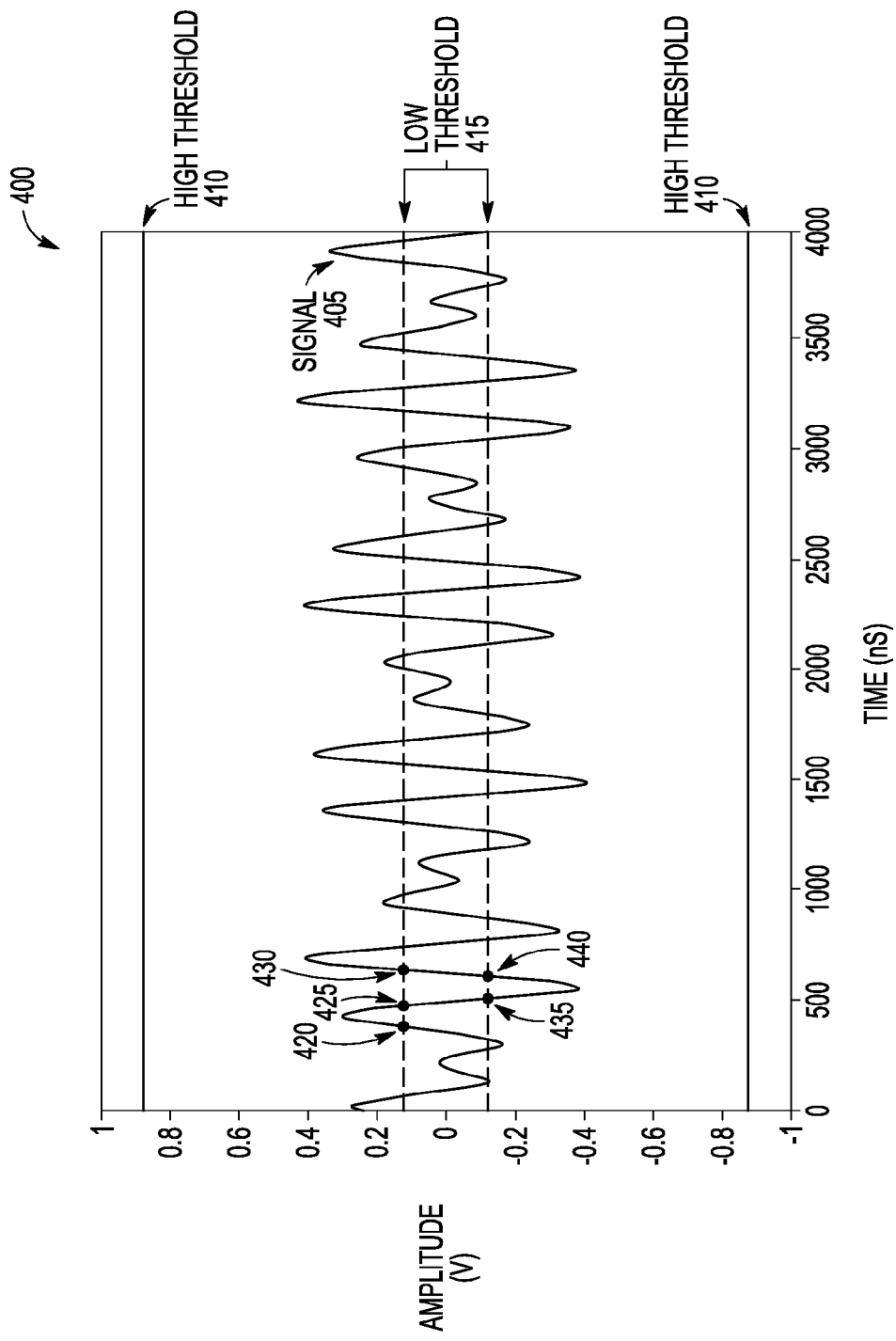

In response to receipt of one or more detection signals and expiration of the monitoring window, AGC module 145 is configured to consult a gain profile lookup table 160 using the detection signal(s) and monitoring window expiration as index criteria for looking up a particular gain profile to implement in receiver system 100. The gain profile lookup table 160 indicates the gain values of the gain control signals 170 and 165, based on conditions of the receiver system 100 as indicated by the detection signals. AGC module 145 is then configured to apply a valid gain adjustment or change to one or more gain elements in receiver system 100 by outputting a TCA/TZA gain control signal 170 and a BBF gain control signal 165 that reflects the valid gain adjustment. As noted above, in some embodiments, a single (e.g., tied) TCA/TZA gain control signal 170 is provided to TCA, TZA-I, and TZA-Q. In other embodiments (not shown), separate and independent gain control signals are provided to TCA, TZA-I, and TZA-Q. Example signals presented to a peak detector of receiver system 100 implementing AGC module 145 are illustrated in FIG. 2-4. Operation of AGC module 145 is further discussed below in connection with FIGS. 5 and 6. Gain profile lookup table 160 is further discussed below in connection with FIGS. 7 and 8.

FIG. 2 illustrates a waveform 200 of an example signal 205 presented to a peak detector, such as TZA peak detector 125 or BBF peak detector 135, of a receiver system 100 that implements the present disclosure. Signal 205 is passed through one or more gain elements, such as TCA, TZA, and/or BBF, before being received at the peak detector. A high threshold value, such as high threshold value 175(1) or 175(2), is provided to the peak detector and is illustrated as high threshold 210 on waveform 200 at both positive and negative values. A high peak detection signal, such as pdet_hi signal 190(1) or 190(2), is generated when the peak detector determines that signal 205 exceeds either the positive or negative value of high threshold 210. A low threshold value, such as low threshold value 180(1) or 180(2), is provided to the peak detector and is illustrated as low threshold 215 on waveform 200 at both positive and negative values. A low peak detection signal, such as pdet_lo signal 195(1) or 195(2), is generated when the peak detector determines that signal 205 exceeds either the positive or negative value of low threshold 215. The low threshold is further discussed in connection with FIG. 3.

In some embodiments, a set of high and low threshold values is defined for each peak detector implemented in receiver system 100, such as one set of threshold values for TZA peak detector 125 and another set of threshold values for BBF peak detector 135. In other embodiments, a single set of high and low threshold values is defined for all peak detectors implemented in receiver system 100.

In FIG. 2, the amplitude of signal 205 is illustrated as exceeding the negative value of high threshold 210 at point 220. In response, the peak detector generates high peak detection signal (pdet_hi) to notify AGC module 145. From point 220 to point 225, the peak detector repeatedly generates pdet_hi as the peak detector continues detecting that the amplitude of signal 205 exceeds high threshold 210. Once the amplitude stops exceeding high threshold 210 after point 225, the peak detector stops generating pdet_hi. Then again at point 230 where the amplitude of signal 205 exceeds the positive value of high threshold 210, the peak detector begins generating pdet_hi repeatedly until point 235. In response to receipt of the detection signal pdet_hi, the AGC controls the gain of one or more of the gain elements in receiver system 100 in order to scale down signal 205 to remain within the positive and negative values of the high threshold. In the embodiment illustrated in FIG. 2, the amplitude of signal 205 is reduced around 1000 ns and remains within the band defined by the positive and negative values of high threshold 210.

FIG. 3 illustrates a waveform 300 of an example signal 305 presented to a peak detector of a receiver system 100 that implements the present disclosure. An amplitude of signal 305 is illustrated as failing to exceed either positive and negative values of a low threshold value 315 during a low peak monitoring window 320, which is a period of time measured from time t0 to t1. Since the amplitude of signal 305 fails to exceed either positive and negative values of low threshold 315 from time t0 to time t1, the peak detector does not generate a low peak detection signal (pdet_lo) during that time period. At time t1, the monitoring window expires and is reset by AGC module 145. The peak detector continues detecting whether the amplitude of signal 305 exceeds low threshold 315.

In response to expiration of the monitoring window 320 (during which the amplitude of signal 305 fails to exceed either positive and negative values of low threshold 315), AGC module controls the gain of one or more of the gain elements in receiver system 100 in order to scale up signal 205 to exceed the positive and negative values of the low threshold. In the embodiment illustrated in FIG. 3, the amplitude of signal 305 is increased around 1250 ns and exceeds the positive value of low threshold 315 at point 325.

In response to the amplitude of signal 305 exceeding the low threshold 315, the peak detector generates detection signal pdet_lo. In response to receipt of pdet_lo signal, AGC module resets the monitoring window. In some embodiments, AGC module resets the monitoring window associated with the pdet_lo signal (e.g., the monitoring window associated with the peak detector that generated the pdet_lo signal). The peak detector continues detecting whether the amplitude of signal 305 exceeds low threshold 315.

From point 325 to point 330, the monitoring window is repeatedly reset by the AGC module each time pdet_lo signal is received (e.g., each time AGC module monitors or checks whether pdet_lo signal is received). At point 330, the monitoring window is not reset since the pdet_lo signal is no longer received (due to the signal 305 failing to exceed the low threshold). The monitoring window runs until point 335, where AGC module resets the monitoring window in response to receipt of pdet_lo signal (which is generated in response to the amplitude of signal 305 exceeding the negative value of the low threshold 315). The monitoring window is repeatedly reset until point 340. The monitoring window begins to run at point 340, and the AGC module continues to monitor and reset the associated monitoring window in this manner as the pdet_lo signal is received.

FIG. 4 illustrates a waveform 400 of an example signal 405 presented to a peak detector of a receiver system 100 that implements the present disclosure. As illustrated, the amplitude of signal 405 repeatedly exceeds low threshold 415 within the monitoring window (e.g., at points 420, 425, 430, 435, 440) and does not exceed high threshold 410. The peak detector does not generate detection signal pdet_hi while the amplitude of signal 405 does not exceed high threshold 410. The peak detector generates detection signal pdet_lo while the amplitude of signal 405 exceeds low threshold 415.

Figure 5:
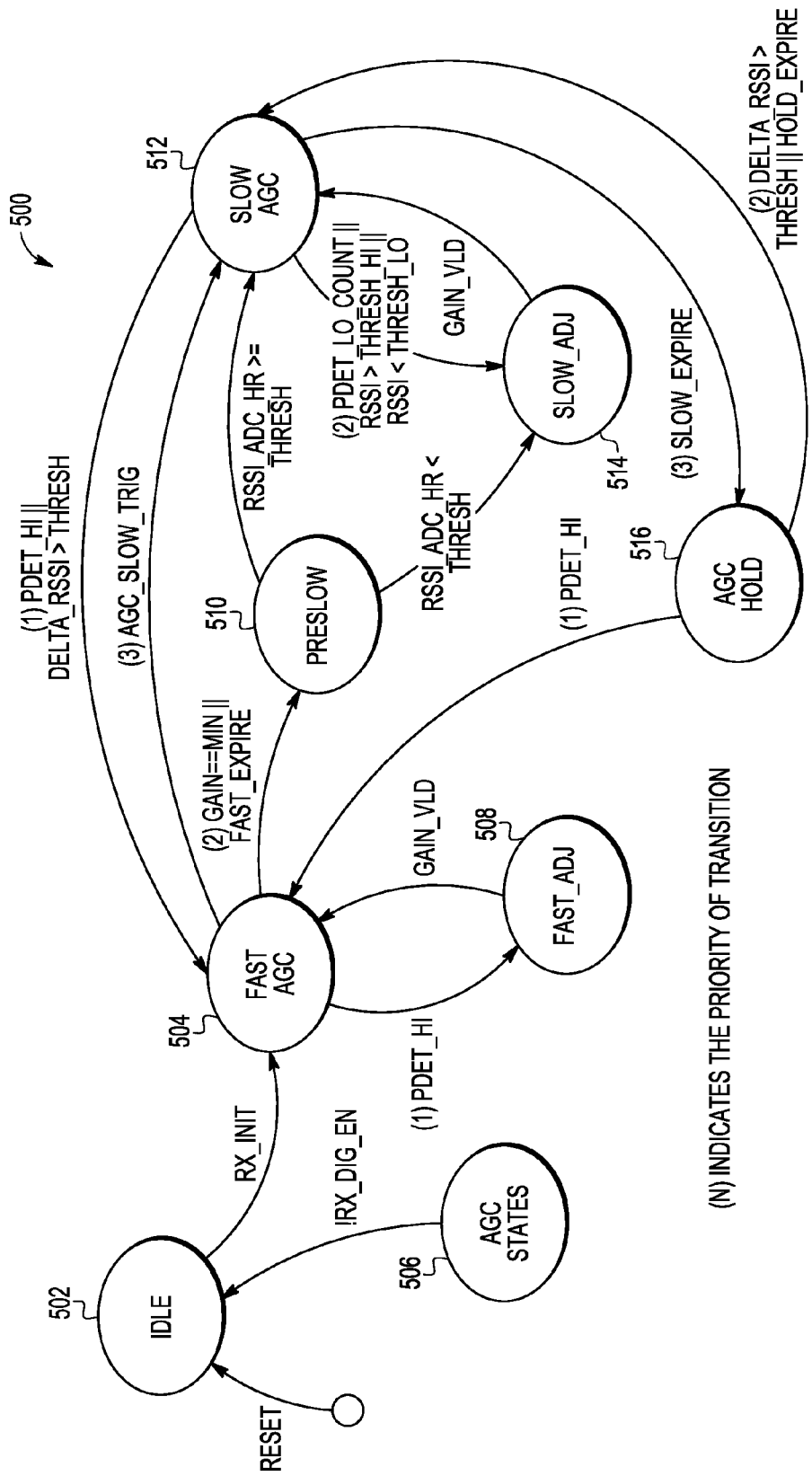
FIG. 5 illustrates an example state diagram of an automatic gain control module in which the present disclosure is implemented, according to some embodiments.

FIG. 5 illustrates an example state diagram of an automatic gain control (AGC) module in which the present disclosure is implemented. Each state transition is illustrated by an arrow, where a state transition occurs when a transition condition is met. Each transition condition is based on one or more detection signals received by AGC module. Some state transitions illustrated in FIG. 5 are prioritized, as indicated by the number value in parentheses. A highest priority transition is illustrated with (1), while a next-highest priority transition is illustrated with (2), and so on. If more than one transition condition is met or satisfied, the highest priority transition of those satisfied transition conditions is taken.

On reset of the receiver system 100 (e.g., reset signal is set), AGC module enters idle state 502. AGC module also enters idle state 502 from other AGC states 506 upon trigger of a digital receiver enable signal being turned off or cleared (shown as IRX_DIG_EN). In idle state 502, AGC module's control of the gain elements in the receiver system is disabled while the AGC module waits for either a receive sequence to be triggered by receipt of a preamble sequence of a data transmission or for an AGC override to be enabled (e.g., using a programmable register). The front-end gain of the receiver (e.g., gain of TCA, TZA, BBF) is also set by a gain value in a programmable register.

From idle state 502, AGC module transitions to fast AGC state 504 upon trigger of a receiver initialization signal (e.g., RX_INIT is set). In some embodiments, the receiver system is initialized at a maximum front-end gain (e.g., TCA/TZA and BBF are set to a maximum gain), as indicated by the gain value in the programmable register. Once in fast AGC state 504, AGC module's control of the gain elements in the receiver system is enabled and AGC module monitors the peak detectors and RSSI circuit for any detection signals, as discussed below.

From fast AGC state 504, AGC module transitions to one of fast ADJ state 508, preslow state 510, or slow AGC state 512, based on prioritized transition conditions. AGC module transitions to fast ADJ state 508 upon receipt of a pdet_hi signal from one of the peak detectors (e.g., pdet_hi is set, indicating the signal passed by the receiver system has exceeded the high threshold and is too strong), which is a first (or highest) priority transition from fast AGC state 504. Once in fast ADJ state 508, AGC module decreases the front-end gain of receiver system by adjusting one or more gain control signals of the gain elements in the receiver system (e.g., TCA, TZA, BBF). In some embodiments, the gain adjustments made in fast ADJ state 508 are large in order to quickly adjust the signal to be within the high threshold. From fast ADJ state 508, AGC module transitions back to fast AGC state 504 once a valid gain adjustment is applied to the one or more gain elements (e.g., gain_vld), which includes a gain adjustment of zero if the front-end gain has already been adjusted to a minimum front-end gain level. Once a valid gain adjustment is applied, RSSI circuit is reset and the peak detectors are disabled (e.g., clear signals 185(1) and 185(2) are triggered) for a programmable amount of time that is related to the bandwidth of the gain elements and expected settling time based on signal dynamics.

In some embodiments (not shown), fast AGC state 504 transitions to fast ADJ state 508 also upon detection that the low peak monitoring window has expired. In such embodiments, AGC module increases the front-end gain of receiver system by adjusting one or more gain control signals, which may be large gain adjustments to quickly adjust the signal to exceed the low threshold.

From fast AGC state 504, AGC module transitions to preslow state 510 upon detection that the front-end gain is equal to a minimum front-end gain level (e.g., gain==min, indicating that front-end gain cannot be further reduced), or upon detection that a fast gain change detection window has expired (e.g., fast_expire, where detection of a gain adjustment resets the fast gain change detection window or time period, and expiration of the fast gain change detection window indicates that no gain adjustments have been made during the fast gain change detection window). This transition is a second (or next-highest) priority transition from fast AGC state 504. Once in preslow state 510, AGC module also monitors digital measurements and detections of RSSI circuit, such as the ADC headroom of ADC-I and ADC-Q, which is the difference between a maximum amplitude of the passed signal and the maximum amplitude that can be handled by the ADC without clipping or loss of the signal (also referred to as a saturation level). If the ADC headroom is less than a headroom threshold (indicating that additional headroom is desired), AGC module transitions to slow ADJ state 514. If the ADC headroom is greater or equal to the headroom threshold (indicating that the present headroom is satisfactory), AGC module transitions to slow AGC state 512.

In slow ADJ state 514, AGC module decreases the front-end gain (if possible) to increase ADC headroom. In some embodiments, the gain adjustments made in slow ADJ state 514 are small in order to "fine tune" the signal passed by the receiver system. From slow ADJ state 514, AGC module transitions to slow AGC state 512 once a valid gain adjustment is applied to the one or more gain elements (e.g., gain_vld), which includes a gain adjustment of zero if the front-end gain has already been adjusted to a minimum front-end gain level. Once a valid gain adjustment is applied, RSSI circuit is reset and the peak detectors are disabled (e.g., clear signals 185(1) and 185(2) are triggered) for a programmable amount of time that is related to the bandwidth of the gain elements and expected settling time based on signal dynamics.

In slow AGC state 512, AGC module monitors peak detectors and RSSI circuit. From slow AGC state 512, AGC module transitions to one of fast AGC state 504, slow ADJ state 514, or AGC hold state 516, based on prioritized transition conditions. AGC module transitions to fast AGC state 504 upon receipt of the detection signal pdet_hi (e.g., pdet_hi is set, indicating the signal passed by the receiver system has exceeded the high threshold and is too strong), which may result when an interference signal is present to interrupt the signal passed by the receiver system. AGC module also transitions to fast AGC state 504 upon detection that a change in RSSI level (or delta RSSI) of one of the I-channel or Q-channel is greater than the delta RSSI threshold. A large spike in RSSI level may indicate an interference signal is present, while a large drop in RSSI level may indicate an interference signal is no longer present. This transition is a first (or highest) priority transition from slow AGC state 512.

AGC module transitions to slow ADJ state 514 upon detecting that the low peak monitoring window has expired (e.g., pdet_lo count reaches a maximum value, indicating that the signal passed by the receiver system has not exceeded the low threshold within the monitoring window and is too weak). AGC module also transitions to slow ADJ 514 upon detection that a present RSSI level of one of the I-channel or Q-channel is above a high RSSI threshold or below a low RSSI threshold, indicating that the I-channel or Q-channel is too strong or too weak, respectively. This transition is a second (or next-highest) priority transition from slow AGC state 512. Once in slow ADJ state 514, AGC module increases front-end gain to increase the strength of the respective I-channel or Q-channel signal (if the present RSSI level indicates that the signal is too weak or if the low peak monitoring window has expired), or decreases front-end gain (if possible) to decrease the strength of the respective I-channel or Q-channel signal (if the present RSSI level indicates that the signal is too strong). AGC module also resets the low peak monitoring window.

From slow AGC state 512, AGC module transitions to AGC hold state 516 upon detection that a slow gain change detection window has expired (e.g., slow_expire, where detection of a gain adjustment resets the slow gain change detection window or time period, and expiration of the slow gain change detection window indicates that no gain adjustments have been made during the slow gain change detection window). This transition is a third (or least-highest) priority transition from slow AGC state 512. Once in AGC hold state 516, AGC module's control of the gain elements in the receiver system is disabled and the front-end gain is maintained at the presently-set level. AGC module also continues to monitor the peak detectors and RSSI circuit. During AGC hold state 516, a processor of the receiver system has identified that a valid packet is received and the processor is in a demodulation state, or a state in which packets of a data transmission are detected and received.

AGC module transitions from AGC hold state 516 to either fast AGC state 504 or slow AGC state 512, based on prioritized transition conditions. From AGC hold state 516, AGC module transitions to fast AGC state 504 upon receipt of the detection signal pdet_hi (e.g., pdet_hi is set, indicating the signal passed by the receiver system has exceeded the high threshold and is too strong), which may result when an interference signal is present to interrupt the signal passed by the receiver system. This transition is a first (or highest) priority transition from AGC hold state 516. In some embodiments, AGC module also transitions to fast AGC state 504 in response to the receiver system restarting the receive sequence.

From AGC hold state 516, AGC module transitions back to slow AGC state 512 upon detection that a change in RSSI level (or delta RSSI) of one of the I-channel or Q-channel is greater than a delta RSSI threshold. A large spike in RSSI level may indicate an interference signal is present and front-end gain should be reduced to compensate for the interference (e.g., from slow AGC state 512, AGC module transitions to slow ADJ state 514 due to a present RSSI level being greater than a high RSSI threshold). A large drop in RSSI level may indicate an interference signal is no longer present and front-end gain should be increased to compensate for the lack of interference (e.g., from slow AGC state 512, AGC module transitions to slow ADJ state 514 due to a present RSSI level being less than a low RSSI threshold). AGC module also transitions to slow AGC state 512 upon detection that a hold operation window has expired (e.g., hold_expire, where the hold operation window is a programmable period of time that indicates a maximum amount of time during which the AGC module remains in AGC hold state). This transition is a second (or next-highest) priority transition from AGC hold state 516.

Finally, from fast AGC state 504, AGC module transitions to slow AGC state 512 upon detection that the processor of the receiver system is in a packet detection and receipt state (e.g., AGC_slow_trig), indicating that the receiver system has achieved an initial gain level used to successfully detect and receive packets of a data transmission. This is a third (or least highest) priority transition from fast AGC state 504. AGC slow trigger is set when a desired signal attribute is received, such as upon receipt of the packet header after the preamble. In this manner, slow AGC state 512 and slow ADJ 514 provide fine tuning of the signal passed by receiver system using smaller steps in gain, while fast AGC state 504 and fast ADJ state 508 provide quick coarse tuning of the signal passed by receiver system using larger steps in gain. In this manner, AGC module provides a better quality version of the signal passed by the receiver system.

Figure 6:
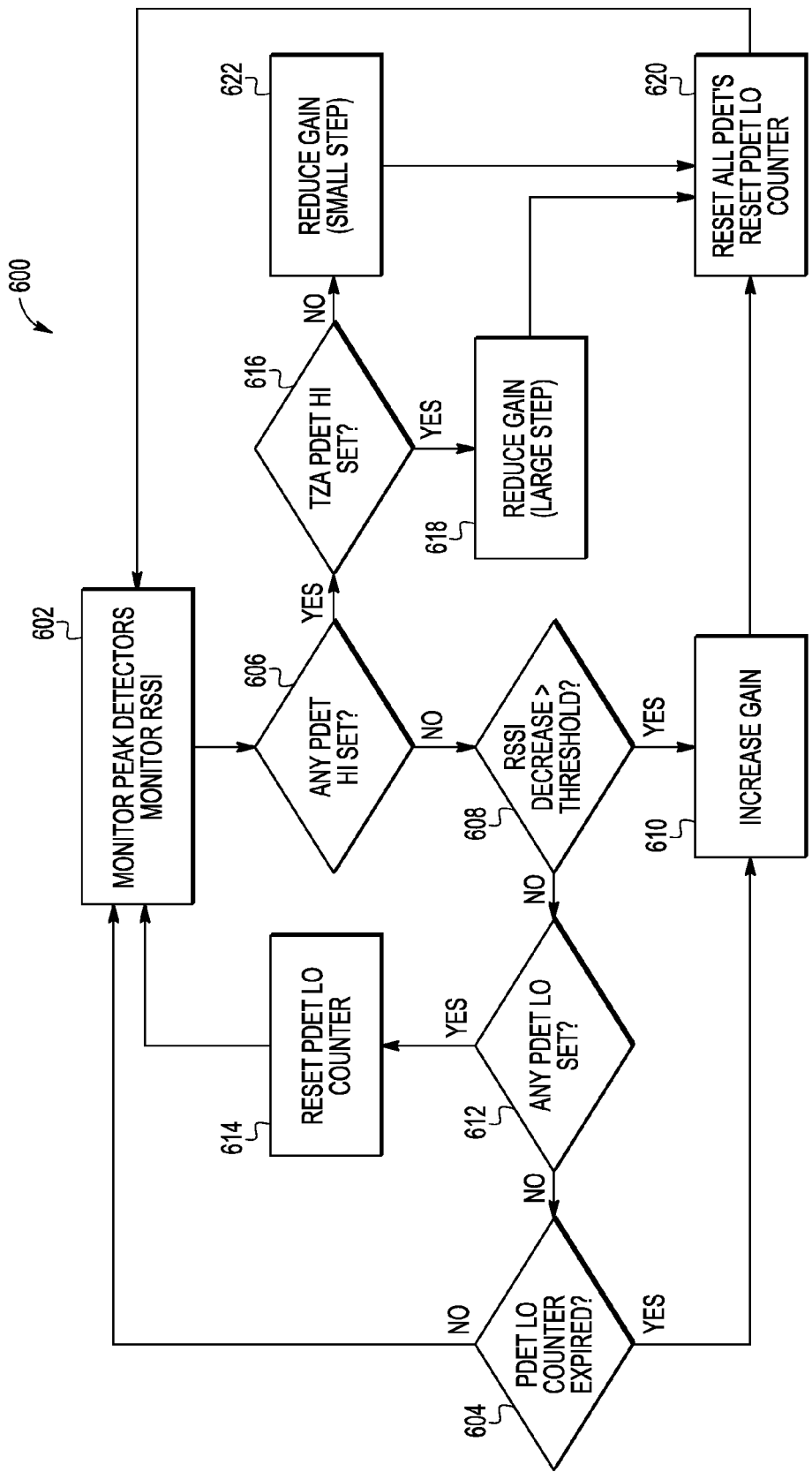
FIG. 6 illustrates a block diagram depicting an example gain control process implemented by the present disclosure, according to some embodiments.

FIG. 6 illustrates a block diagram depicting an example gain control process in which the present disclosure is implemented. The process illustrated in FIG. 6 is a simplified process implemented by an automatic gain control (AGC) module involving high and low peak detection signals and delta RSSI. Other embodiments of a gain control process may also include other RSSI detections, such as whether RSSI levels are less than or greater than a set of RSSI thresholds and whether headroom of an ADC is less than or greater than a headroom threshold, as discussed above in connection with FIG. 5.

The process illustrated in FIG. 6 begins at operation 602, where the AGC module monitors peak detectors and the RSSI circuit for receipt of any detection signals. While not shown, AGC module initializes a pdet_lo counter to zero during initialization of the receiver system prior to beginning monitoring of the peak detectors and RSSI circuit. Pdet_lo counter is configured to count up to a maximum value in order to track a low peak monitoring window, where the low peak monitoring window expires upon pdet_lo counter reaching the maximum value.

The process continues to operation 606, where AGC module determines whether any high peak detection signal (pdet_hi) of the peak detectors is set. If pdet_hi is set, the process continues to operation 616, where AGC module determines whether pdet_hi is associated with one of TZA-I or TZA-Q. If pdet_hi is associated with TZA-I or TZA-Q, the process continues to operation 618, where AGC module reduces front-end gain of the receiver system by a large step. The process then continues to operation 620, where AGC module resets all peak detectors in receiver system (e.g., by triggering clear signals 185(1) and 185(2)) and resets the pdet_lo counter (or resets the low peak monitoring window). The process then returns to operation 602, where AGC module continues monitoring the peak detectors and RSSI circuit.

Returning to operation 616, if pdet_hi is not associated with either TZA-I or TZA-0, the process continues to operation 622, where AGC module determines that pdet_hi is associated with either BBF-I or BBF-Q and reduces front-end gain by a small step. The process then continues to operation 620, where AGC module resets all peak detectors in receiver system and resets the pdet_lo counter (or resets the low peak monitoring window). The process then returns to operation 602, where AGC module continues monitoring the peak detectors and RSSI circuit.

Returning to operation 606, if no pdet_hi signals are set, the process continues to operation 608, where AGC module determines whether a delta RSSI (or change in RSSI levels of either I-channel or Q-channel) is greater than a predetermined delta RSSI threshold. In the embodiment illustrated in operation 608, AGC module determines whether an RSSI decrease is greater than the delta RSSI threshold, which occurs if the RSSI level of the baseband signals (since it is expected that I-channel and Q-channel change simultaneously) drops by more than the delta RSSI threshold. If the RSSI decrease is greater than the delta RSSI threshold, the process continues to operation 610, where AGC module increases front-end gain in order to compensate for a received packet or possibly for an interference signal that is no longer present. The process then continues to operation 620, where AGC module resets all peak detectors in receiver system (e.g., by triggering clear signals 185(1) and 185(2)) and resets the pdet_lo counter (or resets the low peak monitoring window). The process then returns to operation 602, where AGC module continues monitoring the peak detectors and RSSI circuit.

Returning to operation 608, if no delta RSSIs (e.g., for either I-channel or Q-channel) are greater than delta RSSI threshold, the process continues to operation 612, where AGC module determines whether any low peak detection signal (pdet_lo) of the peak detectors is set. If pdet_lo is set, the process continues to operation 614, where AGC module resets the pdet_lo counter. The process then continues to operation 602, where AGC module continues monitoring the peak detectors and RSSI circuit.

Returning to operation 612, if no pdet_lo signals are set, the process continues to operation 604, where AGC module determines whether the pdet_lo counter has expired, or has reached a maximum value. If the pdet_lo counter has expired, the process continues to operation 610, where AGC module increases front-end gain. The process then continues to operation 620, where AGC module resets all peak detectors (e.g., by triggering clear signals 185(1) and 185(2)) and resets the pdet_lo counter. The process then returns to operation 602, where AGC module continues monitoring the peak detectors and RSSI circuit.

Finally, returning to operation 604, if the pdet_lo counter has not expired, the process continues to operation 602, where AGC module continues monitoring the peak detectors and RSSI circuit.

Figures 7, 8:
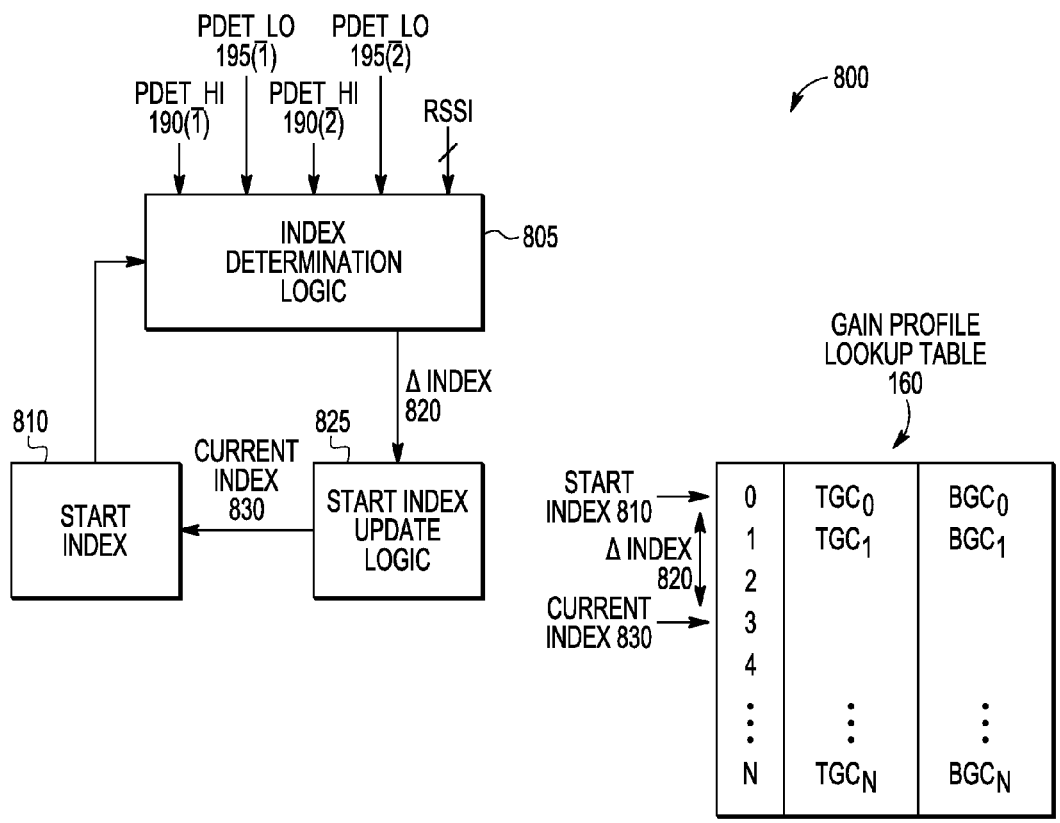
FIG. 7 illustrates a block diagram depicting an example gain profile lookup table in which the present disclosure is implemented, according to some embodiments.
FIG. 8 illustrates a block diagram depicting example gain profile computation logic in which the present disclosure is implemented, according to some embodiments.

FIG. 7 illustrates a block diagram depicting an example embodiment 700 of a gain profile lookup table 160 in which the present disclosure is implemented. Table 700 includes an index 705 for table entries (0)-(N), where each entry includes a TCA/TZA gain control value 710 used for TCA/TZA gain control signal 170 (also referred to as a TGC value) and a BBF gain control value 715 used for BBF gain control signal 165 (or a BGC value). Table entries in table 700 are ordered according to front-end gain control values, where a maximum front-end gain level is provided in an initial table entry (e.g., entry located at index 0) and the subsequent table entries each provide a diminishing front-end gain level (e.g., the gain control values of each subsequent table entry become progressively smaller) until a minimum front-end gain level is provided in a final table entry (e.g., entry located at index N).

Table 700 is implemented for an embodiment in which the gain control provided to TCA, TZA-I, and TZA-Q are tied (e.g., the same gain control value). In other embodiments of gain profile lookup table 160, a TCA gain control value separate from a TZA gain control value may be included in each table entry. Similarly, in still other embodiments, a TZA-I gain control value separate from a TZA-Q gain control value may be included in each table entry and a BBF-I gain control value separate from a BBF-Q gain control value may be included in each table entry. As further discussed in connection with FIG. 8, AGC module selects one of the table entries using the peak detection signals, RSSI detection signals, and expiration of monitoring window.

FIG. 8 illustrates a block diagram depicting example gain profile computation logic 800 in which the present disclosure is implemented. Computation logic 800 is implemented in an AGC module. Computation logic 800 includes index determination logic 805 and start index update logic 825. Upon initialization of the receiver system, gain profile lookup table 160 has a start index 810 pointing to an initial table entry (e.g., index 0). Like the embodiment illustrated in FIG. 7, the initial table entry provides a maximum front-end gain level, with subsequent table entries providing diminishing front-end gain levels.

Index determination logic 805 is configured to determine or calculate a change in index value (Δindex) 820 based on peak detection signals received from both peak detectors (e.g., pdet_hi 190(1) and 190(2), and pdet_lo 195(1) and 195(2)), a number of RSSI detection signals received from RSSI, and whether a low peak monitoring window has expired. Change in index value 820 indicates whether front-end gain needs to be reduced (e.g., the start index should be adjusted down toward index N), increased (e.g., the start index should be adjusted up toward index 0), or held at the same value (e.g., Δindex of zero). Change in index value 820 also indicates the step size of such an adjustment (e.g., large or small). The peak detection signals, the RSSI detection signals, and low peak monitoring window expiration each correspond to a gain determination component that affects the change in index value 820. The gain determination components may be weighted differently, affecting the change in index value 820 differently. For example, a triggered pdet_hi signal may indicate that the front-end gain level should be reduced by some magnitude (e.g., equivalent to adjusting the start index down toward index N by 5), while absence of a triggered pdet_lo signal and expiration of low peak monitoring window together indicate that the front-end gain level should be increased by some smaller magnitude (e.g., equivalent to adjusting the start index up toward index 0 by 2).

Index determination logic 805 is configured to provide the change in index value 820 to start index update logic 825, which is configured to adjust the start index to a valid updated or current index 830 based on the change in index value 820. For example, if the start index is located at index N and the change in index value 820 indicates that the index should be adjusted down further, start index update logic 825 returns the same index N as the current index 830 since no valid adjustment can be made (e.g., the front-end gain cannot be further reduced). Similarly, if the start index is located at index N-1 and the change in index value 820 indicates that the index should be adjusted down by 2, start index update logic 825 returns index N as the current index 830 since the index can only be validly adjusted by 1.

As illustrated in FIG. 8, the start index 810 of lookup table 160 is adjusted to the current index 830 (e.g., moved down by 3), which becomes the new start index 810 of table 160. Each gain control value in the entry corresponding to the new start index 810 is then output by the AGC module to respective gain elements (e.g., TGC3 is output as TCA/TZA gain control 170, BGC3 is output as BBF gain control 165). In this manner, an adjustment made to the start index 810 corresponds to a gain adjustment applied to one or more gain elements in receiver system 100. The (new) start index 810 is then provided to index determination logic 805, which calculates the next index adjustment based on the (now present) start index 810.

By now it should be appreciated that there has been provided embodiments of a receiver system that implements an automatic gain control scheme that is able to immediately adjust one or more gain levels of one or more gain elements in the receiver system, based on triggered peak detection signals and RSSI levels.

In one embodiment of the present disclosure, a receiver system is provided, which includes a first peak detector module coupled to receive a first differential pair of in-phase signals and a first differential pair of quadrature signals, a second peak detector module coupled to receive a second differential pair of in-phase signals and a second differential pair of quadrature signals, a first high threshold and a first low threshold for the first peak detector module, and a second high threshold and a second low threshold for the second peak detector module. The receiver system also includes an automatic gain control (AGC) module, where the first peak detector module is coupled to provide a first high peak detection signal and a first low peak detection signal to the automatic gain control module, and the second peak detector module is coupled to provide a second high peak detection signal and a second low peak detection signal to the automatic gain control module. The AGC module is configured to adjust a first gain determination component when at least one of the first differential pair of in-phase or quadrature signals is outside the first high threshold or within the first low threshold, adjust a second gain determination component when at least one of the second differential pair of in-phase or quadrature signals is outside the second high threshold or within the second low threshold, and use the first and second gain determination components to generate at least a first gain control signal.

One aspect of the above embodiment provides that the receiver system further includes a first in-phase amplifier and a first quadrature amplifier coupled to receive the first gain control signal.

A further aspect of the above embodiment provides that the automatic gain control module is further configured to use the first and second gain determination component to generate at least a second gain control signal. The receiver system further includes a second in-phase amplifier and a second quadrature amplifier coupled to receive the second gain control signal.

Another aspect of the above embodiment provides that the receiver system further includes a received signal strength indicator (RSSI) configured to provide an input to the AGC to maintain a selected signal level in the receiver system based on output of the second in-phase and quadrature amplifiers.

A further aspect of the above embodiment provides that the receiver system further includes logic instructions in the AGC to: adjust the first and second gain control signals in a fast mode when a change between a current output of the RSSI and a previous output of the RSSI is greater than a RSSI change threshold; and adjust the first and second gain control signals in a slow mode when a desired signal is detected in the receiver system.

Another aspect of the above embodiment provides that the first differential pair of in-phase signals are output by the first in-phase amplifier and the first differential pair of quadrature signals are output by the first quadrature amplifier; and the second differential pair of in-phase signals are output by the second in-phase amplifier and the second differential pair of quadrature signals are output by the second quadrature amplifier.

Another aspect of the above embodiment provides that the first in-phase amplifier and the first quadrature amplifier are one of a group consisting of transconductance amplifiers and transimpedance amplifiers.

Another aspect of the above embodiment provides that the second in-phase amplifier and the second quadrature amplifier are a baseband filter and amplify circuit.

Another aspect of the above embodiment provides that the AGC remains in a fast mode until the fast mode times out or the first and second gain control signals are at minimum values. When at least one of the first and second gain control signals is adjusted, the AGC module resets a received signal strength indicator (RSSI), and for a predetermined amount of time, the AGC module ignores the at least one of the first differential pair of in-phase or quadrature signals being outside the first high threshold or within the first low threshold, and the at least one of the second differential pair of in-phase or quadrature signals being outside the second high threshold or within the second low threshold.

In another embodiment of the present disclosure, a semiconductor device is provided, which includes a receiver system that includes a first set of amplifiers; a second set of amplifiers; and an automatic gain control (AGC) module. The AGC module includes logic instructions configured to: receive first high and low detection signals from a first peak detector; receive second high and low detection signals from a second peak detector; when the first high detection signal is set, make a step decrease in at least one of a first gain control signal and a second gain control signal, when the first high detection signal is not set and the second high detection signal is set, make a second step decrease in at least one of the first gain control signal and the second gain control signal, use the first gain control signal in the first set of amplifiers, and use the second gain control signal in the second set of amplifiers.

One aspect of the above embodiment provides that the logic instructions are further configured to: when neither the first or second high detection signals are set and neither the first and second low detection signals are set, increase at least one of the first and second gain control signals.

Another aspect of the above embodiment provides that the logic instructions are further configured to: when the first and second gain control signals have been adjusted, reset the first and second high detection signals and the first and second low detection signals.

Another aspect of the above embodiment provides that the logic instructions are further configured to: when neither the first or second high detection signals are set, a change in a received signal strength indicator is not greater than a threshold value, and neither the first or second low detection signals are set, increase at least one of the first and second gain control signals when a low detection counter is expired.

Another aspect of the above embodiment provides that a first amplifier of the first set of amplifiers outputs a first in-phase signal and a second amplifier of the first set of amplifiers outputs a first quadrature signal; and a first amplifier of the second set of amplifiers outputs a second in-phase signal and a second amplifier of the second set of amplifiers outputs a second quadrature signal.

A further aspect of the above embodiment provides that the first set of amplifiers are one of a group consisting of transconductance amplifiers and transimpedance amplifiers; and the second set of amplifiers are a baseband filter and amplify circuit.

Another aspect of the above embodiment provides that the first high detection signal is not set and the first low detection signal is set when a magnitude of an input signal is below a first high threshold value and above a first low threshold value; and the second high detection signal is not set and the second low detection signal is set when the magnitude of the input signal is below a second high threshold value and above a second low threshold value.

Another aspect of the above embodiment provides that when at least one of the first and second gain control signals is adjusted, the AGC module resets a received signal strength indicator (RSSI), and for a predetermined amount of time, the AGC module ignores the first high and low detection signals, and the second high and low detection signals.

In another embodiment of the present disclosure, a method of operating a receiver is provided, where the method includes setting a first high detection signal when a first signal is above a first high threshold; setting a first low detection signal when the first signal is above a first low threshold; setting a second high detection signal when a second signal is above a second high threshold; and setting a second low detection signal when the second signal is above a second low threshold. The method also includes adjusting at least one gain determination value when at least one of the first and second high detection signals is set; adjusting the at least one gain determination value when at least one of the first and second low detection signals is not set for a period of time; and generating first and second gain control signals based on the at least one gain determination value.

One aspect of the above embodiment provides that the method further includes entering a pre-slow mode when the first and second gain control signals are minimum values or a fast mode timer has expired; and when an output of an analog to digital converter (ADC) is greater than a predetermined amount below a saturation level in the pre-slow mode, adjusting at least one of the first and second gain control signals.

Another aspect of the above embodiment provides that the method further includes entering a hold mode when a slow mode timer expires, wherein the first and second gain control signals remain unchanged while in the hold mode.

The circuitry described herein may be implemented on a semiconductor substrate, which can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A receiver system comprising:
 a first peak detector module coupled to receive a first differential pair of in-phase signals and a first differential pair of quadrature signals;

a first in-phase amplifier and a first quadrature amplifier;
a second peak detector module coupled to receive a second differential pair of in-phase signals and a second differential pair of quadrature signals;
a second in-phase amplifier and a second quadrature amplifier;
a first high threshold and a first low threshold for the first peak detector module;
a second high threshold and a second low threshold for the second peak detector module; and
an automatic gain control (AGC) module, wherein
the first peak detector module is coupled to provide a first high peak detection signal and a first low peak detection signal to the automatic gain control module,
the second peak detector module is coupled to provide a second high peak detection signal and a second low peak detection signal to the automatic gain control module, and
the AGC module is configured to:
adjust a first gain determination component when at least one of the first differential pair of in-phase or quadrature signals is outside the first high threshold or within the first low threshold,
adjust a second gain determination component when at least one of the second differential pair of in-phase or quadrature signals is outside the second high threshold or within the second low threshold,
use the first and second gain determination components to generate at least one of a first gain control signal and a second gain control signal, wherein
the first in-phase amplifier and the first quadrature amplifier are coupled to receive the first gain control signal, and
the second in-phase amplifier and the second quadrature amplifier are coupled to receive the second gain control signal, and
when the at least one of the first gain control signal and the second gain control signal is generated, reset the first peak detector module and the second peak detector module.

2. The receiver system of claim 1 further comprising:
a received signal strength indicator (RSSI) configured to provide an input to the AGC to maintain a selected signal level in the receiver system based on output of the second in-phase amplifier and the second quadrature amplifier.

3. The receiver system of claim 2 further comprising:
logic instructions in the AGC to:
adjust the first and second gain control signals in a fast mode when a change between a current output of the RSSI and a previous output of the RSSI is greater than a RSSI change threshold; and
adjust the first and second gain control signals in a slow mode when a desired signal is detected in the receiver system.

4. The receiver system of claim 1 wherein
the first differential pair of in-phase signals are output by the first in-phase amplifier and the first differential pair of quadrature signals are output by the first quadrature amplifier; and
the second differential pair of in-phase signals are output by the second in-phase amplifier and the second differential pair of quadrature signals are output by the second quadrature amplifier.

5. The receiver system of claim 1 wherein the first in-phase amplifier and the first quadrature amplifier are one of a group consisting of transconductance amplifiers and transimpedance amplifiers.

6. The receiver system of claim 1 wherein the second in-phase amplifier and the second quadrature amplifier are a baseband filter and amplify circuit.

7. The receiver system of claim 1 wherein
the AGC remains in a fast mode until the fast mode times out or the first and second gain control signals are at minimum values, and
when at least one of the first and second gain control signals is adjusted,
the AGC module resets a received signal strength indicator (RSSI), and
for a predetermined amount of time, the AGC module ignores the at least one of the first differential pair of in-phase or quadrature signals being outside the first high threshold or within the first low threshold, and the at least one of the second differential pair of in-phase or quadrature signals being outside the second high threshold or within the second low threshold.

8. A semiconductor device comprising:
a receiver system including:
a first set of amplifiers;
a second set of amplifiers; and
an automatic gain control (AGC) module including logic instructions configured to:
receive first high and low detection signals from a first peak detector;
receive second high and low detection signals from a second peak detector;
when the first high detection signal is set, make a first step decrease in at least one of a first gain control signal and a second gain control signal,
when the first high detection signal is not set and the second high detection signal is set, make a second step decrease in at least one of the first gain control signal and the second gain control signal,
use the first gain control signal in the first set of amplifiers,
use the second gain control signal in the second set of amplifiers, and
when the first and second gain control signals have been adjusted, reset the first and second high detection signals and the first and second low detection signals.

9. The device of claim 8 wherein the logic instructions are further configured to:
when neither the first or second high detection signals are set and neither the first and second low detection signals are set, increase at least one of the first and second gain control signals.

10. The device of claim 8 wherein the logic instructions are further configured to:
when neither the first or second high detection signals are set, a change in a received signal strength indicator is not greater than a threshold value, and neither the first or second low detection signals are set, increase at least one of the first and second gain control signals when a low detection counter is expired.

11. The device of claim 8 wherein:
a first amplifier of the first set of amplifiers outputs a first in-phase signal and a second amplifier of the first set of amplifiers outputs a first quadrature signal; and a first amplifier of the second set of amplifiers outputs a second in-phase signal and a second amplifier of the second set of amplifiers outputs a second quadrature signal.

12. The device of claim 11 wherein:
the first set of amplifiers are one of a group consisting of transconductance amplifiers and transimpedance amplifiers; and
the second set of amplifiers are a baseband filter and amplify circuit.

13. The device of claim 8 wherein:
the first high detection signal is not set and the first low detection signal is set when a magnitude of an input signal is below a first high threshold value and above a first low threshold value; and
the second high detection signal is not set and the second low detection signal is set when the magnitude of the input signal is below a second high threshold value and above a second low threshold value.

14. The device of claim 8 wherein:
when at least one of the first and second gain control signals is adjusted,
the AGC module resets a received signal strength indicator (RSSI), and
for a predetermined amount of time, the AGC module ignores the first high and low detection signals, and the second high and low detection signals.

15. A method of operating a receiver comprising:
setting a first high detection signal when a first signal is above a first high threshold;
setting a first low detection signal when the first signal is above a first low threshold;
setting a second high detection signal when a second signal is above a second high threshold;
setting a second low detection signal when the second signal is above a second low threshold;
adjusting at least one gain determination value when at least one of the first and second high detection signals is set;
adjusting the at least one gain determination value when at least one of the first and second low detection signals is not set for a period of time; and
generating first and second gain control signals based on the at least one gain determination value, wherein the first gain control signal is coupled to a first set of amplifiers in the receiver and the second gain control signal is coupled to a second set of amplifiers in the receiver; and
resetting the first high and low detection signals and the second high and low detection signals in response to generation of the first and second gain control signals.

16. The method of claim 15 further comprising:
entering a pre-slow mode when the first and second gain control signals are minimum values or a fast mode timer has expired; and
when an output of an analog to digital converter (ADC) is greater than a predetermined amount below a saturation level in the pre-slow mode, adjusting at least one of the first and second gain control signals.

17. The method of claim 15 further comprising:
entering a hold mode when
a slow mode timer expires, wherein the first and second gain control signals remain unchanged while in the hold mode.

18. The device of claim 8 wherein:
the first step decrease is larger than the second step decrease.

19. The device of claim 8 wherein
the receiver system further comprises an analog to digital converter (ADC), and
the logic instructions are further configured to:
when neither the first or second high detection signals are set, decrease at least one of the first and second gain control signals when headroom of the ADC is less than a headroom threshold.

20. The receiver system of claim 3 wherein:
the first and second gain control signals are adjusted by a large gain step in the fast mode, and
the first and second gain control signals are adjusted by a small gain step in the slow mode.

* * * * *